(12) United States Patent
Balazs et al.

(10) Patent No.: US 11,705,592 B2
(45) Date of Patent: Jul. 18, 2023

(54) BATTERY MODULE AND AIRCRAFT WITH A BATTERY MODULE

(71) Applicants: Gergely György Balazs, Budapest (HU); Tibor Debreceni, Budapest (HU); Péter Dudás, Eger (HU); Daniel Lorincz, Budapest (HU); Sandor Hallai, Budapest (HU)

(72) Inventors: Gergely György Balazs, Budapest (HU); Tibor Debreceni, Budapest (HU); Péter Dudás, Eger (HU); Daniel Lorincz, Budapest (HU); Sandor Hallai, Budapest (HU)

(73) Assignee: Rolls-Royce Deutschland Ltd & Co KG, Blankenfelde-Mahlow (DE)

( * ) Notice: Subject to any disclaimer, the term of this patent is extended or adjusted under 35 U.S.C. 154(b) by 261 days.

(21) Appl. No.: 17/029,823

(22) Filed: Sep. 23, 2020

(65) Prior Publication Data

US 2021/0104784 A1 Apr. 8, 2021

(30) Foreign Application Priority Data

Oct. 2, 2019 (EP) .................................... 19201080

(51) Int. Cl.
*H01M 10/48* (2006.01)
*B64C 39/02* (2023.01)
*B64U 50/19* (2023.01)

(52) U.S. Cl.
CPC .......... *H01M 10/486* (2013.01); *B64C 39/02* (2013.01); *B64U 50/19* (2023.01); *H01M 2220/20* (2013.01)

(58) Field of Classification Search
CPC .......... H01M 10/486; H01M 2220/20; H01M 10/482; H01M 50/20; H01M 50/502;
(Continued)

(56) References Cited

U.S. PATENT DOCUMENTS

2010/0062329 A1* 3/2010 Muis ................. H01M 10/48
429/158
2012/0221759 A1 8/2012 Yokouchi
(Continued)

FOREIGN PATENT DOCUMENTS

JP 2010016103 A 1/2010
WO 2018225188 A1 12/2018

OTHER PUBLICATIONS

European Search Report for European Application No. 19201080.9-1108 dated Apr. 21, 2020.

*Primary Examiner* — Michael L Dignan
(74) *Attorney, Agent, or Firm* — Lempia Summerfield Katz LLC

(57) ABSTRACT

A battery module is disclosed, which includes: a multiplicity of battery cells; a printed circuit board with a first series-connector with a first pad area and a second pad area, and a second series-connector with a third pad area and a fourth pad area; a cross-connector, which connects the first series-connector between the first pad area and the second pad area with the second series-connector between the third pad area and the fourth pad area; and a sensor configured to detect a cross-current at the cross-connector. The first contact electrode of a first battery cell is connected with the first pad area. The second contact electrode of a second battery cell is connected with the second pad area. The first contact electrode of a third battery cell is connected with the third pad area. The second contact electrode of a fourth battery cell is connected with the fourth pad area.

13 Claims, 3 Drawing Sheets

(58) Field of Classification Search
CPC ............. H01M 50/572; H01M 10/425; H01M 10/4285; B64C 39/02; B64C 2201/042; B64D 27/24; H05K 2201/10037; H05K 2201/10151; H05K 2201/10287; H05K 1/18

See application file for complete search history.

(56) References Cited

U.S. PATENT DOCUMENTS

| | | | | |
|---|---|---|---|---|
| 2013/0260196 | A1* | 10/2013 | Takahashi | H01M 50/204 429/90 |
| 2013/0311008 | A1* | 11/2013 | Kroo | B64D 31/00 244/6 |
| 2014/0134464 | A1 | 5/2014 | Jang | |
| 2014/0212695 | A1* | 7/2014 | Lane | H01M 10/425 429/7 |
| 2014/0255748 | A1* | 9/2014 | Jan | H01M 10/04 429/158 |
| 2015/0024239 | A1 | 1/2015 | Haug | |
| 2015/0364740 | A1* | 12/2015 | De Arroyabe | B23K 20/005 228/180.5 |
| 2016/0118819 | A1* | 4/2016 | Chatroux | B60L 58/12 320/112 |
| 2016/0141585 | A1* | 5/2016 | Berg | H01M 50/522 228/110.1 |
| 2016/0254521 | A1* | 9/2016 | Chatroux | H01M 50/581 429/61 |
| 2017/0010309 | A1* | 1/2017 | Etschmaier | G01R 15/207 |
| 2017/0025657 | A1 | 1/2017 | Reinshagen | |
| 2017/0077487 | A1* | 3/2017 | Coakley | H01M 50/526 |
| 2017/0256769 | A1* | 9/2017 | Wynn | H01M 50/502 |
| 2018/0095137 | A1* | 4/2018 | Yoshioka | G01R 31/3842 |

* cited by examiner

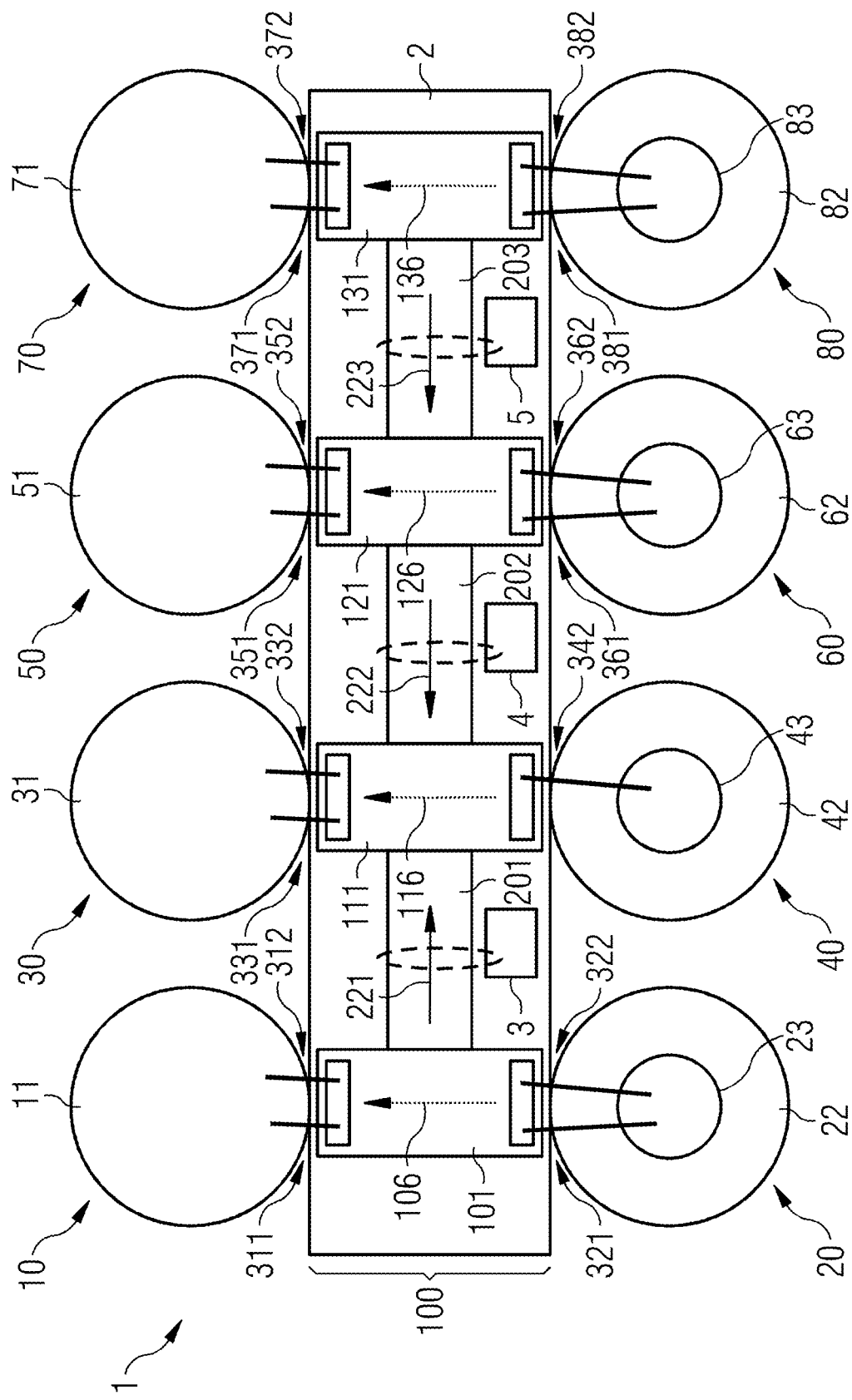

BATTERY MODULE AND AIRCRAFT WITH A BATTERY MODULE

The present patent document claims the benefit of European Patent Application No. 19 201 080.9, filed Oct. 2, 2019, which is hereby incorporated by reference.

TECHNICAL FIELD

The disclosure relates to a battery module and an aircraft with a battery module.

BACKGROUND

In aviation, in particular in electrical aviation, battery performance and monitoring thereof is a critical problem which may affect flight safety, system, or battery module performance or lifespan.

Several measures may be needed to provide adequate battery management, which would lead to a certain amount of weight and space, which mostly is not desired in aviation or other mobility applications. Moreover, installing such a high-performance battery management system in an aircraft may not be feasible. From a safety point of view, overtemperature in batteries may cause fire on board or a battery shutdown, even when detected only at one single point. Besides, uneven temperature distribution may result in shorter battery lifespan.

For instance, to realize an electrical connection between a balancing busbar and individual battery cells in a battery module, wire bonding may be used. However, if one or more bond connection fails, a safety issue arises.

In aviation, multiple bonding may be used for increasing reliability. However, monitoring the health of the bonds in case of redundant bonding is an unsolved problem. In case of electric aviation, this is an extremely important issue, because there may be an extremely high power demand for example during takeoff and a partially failed cell connection may lead to a fire on board.

SUMMARY AND DESCRIPTION

The scope of the present disclosure is defined solely by the appended claims and is not affected to any degree by the statements within this summary. The present embodiments may obviate one or more of the drawbacks or limitations in the related art.

The problem to be solved is to provide an effective battery management system for a battery, in particular in an aircraft environment. In particular, the problem to be solved is to detect partially or entirely failed cell connections, in particular in an efficient and in terms of speed quickly detecting way.

The problem of the disclosure is solved by a battery module, which includes a multiplicity of battery cells. Each cell of the multiplicity of battery cells has a first contact electrode and a second contact electrode. The battery module further includes a printed circuit board with a first series-connector with a first pad area and a second pad area, and at least one second series-connector with a respective third pad area and a respective fourth pad area. The battery module further includes at least one cross-connector, which connects the first series-connector between the first pad area and the second pad area with the at least one second series-connector between the third pad area and the fourth pad area. The first contact electrode of a first battery cell of the multiplicity of battery cells is connected with the first pad area by a first wiring component. The second contact electrode of a second battery cell of the multiplicity of battery cells is connected with the second pad area by a second wiring component. The first contact electrode of a third battery cell of the multiplicity of battery cells is connected with the respective third pad area of the at least one second series-connector by a respective third wiring component. The second contact electrode of a fourth battery cell of the multiplicity of battery cells is connected with the respective fourth pad area of the at least one second series-connector by a respective fourth wiring component. The battery module further includes at least one sensor configured to detect at least one cross-current at the at least one cross-connector.

Thus, a lightweight and effective battery monitoring is enabled by the surveillance of the one or more cross-currents between series circuits of battery cells, which are interconnected in parallel by one or more cross-connectors.

In a further development, the sensor includes a hall sensor or a temperature sensor.

Thus, an efficient surveillance of the one or more cross-current is provided, because the electric load of the battery module leads to significantly increased cross-currents, which may be easily detected by the proposed sensors.

In case of a fault of one element of the battery module, a cross-current may flow through one or more cross-connectors, which indicates an asymmetric balance of the currents flowing through the individual cells, e.g., the series-connectors.

The arrangement is similar to a measurement bridge known in the art.

However, the disclosure provides a combined implementation of such a bridge together with a cell interconnection of the battery module.

In a further development, the sensor is embedded into the printed circuit board.

Thus, a simple and effective coupling is provided between the sensors or components thereof and the one or more cross-connectors where the cross-currents flow in case of a fault.

The problem of the disclosure is also solved by an aircraft, (e.g., with an electric propulsion system), including the battery module according to the disclosure, which powers the electric propulsion system.

All combinations of further developments are explicitly suggested to be combined, and further synergistic effect may be achieved.

BRIEF DESCRIPTION OF THE DRAWINGS

The disclosure will be explained in more detail with reference to an embodiment shown in the accompanying drawings.

FIG. 4 a top view of a further embodiment of a battery module.

It is noted that further parts for the operation of the battery module are not depicted, (e.g., mounting parts, power supply, electric load, or electronic control components). For the sake of better understanding, these parts are not illustrated and described.

DETAILED DESCRIPTION

Figure 1:
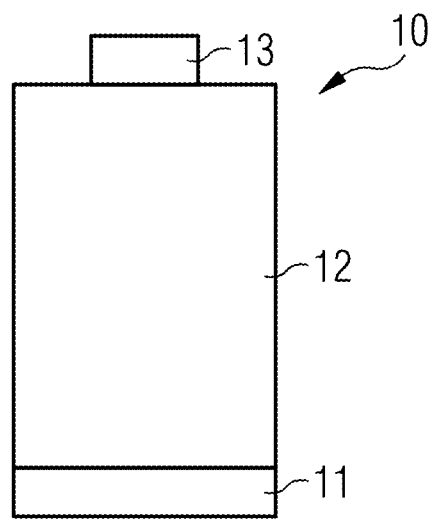
FIG. 1 depicts a side view of a standard battery cell.

FIG. 1 depicts a schematic side view of a standard battery cell 10 with a cylindrical shape. The battery cell 10 includes a negative electrode 11, a cell body 12, and a positive electrode 13.

The battery cell 10 is one embodiment of a battery cell for the battery module, as the shape or geometry is not essential for the principle of the disclosure.

Figure 2:
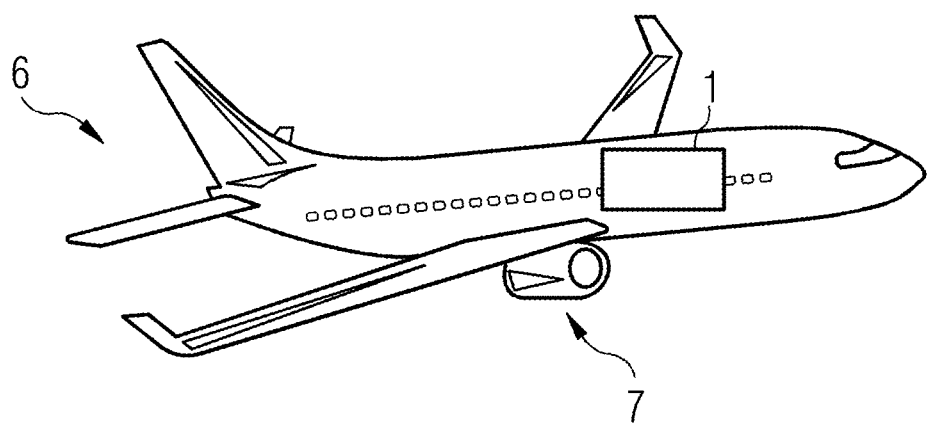
FIG. 2 depicts a schematic overview of an aircraft with a battery module according to an embodiment.

FIG. 2 depicts an embodiment with a battery module 1, installed at an aircraft 6 with an electric propulsion 3. The battery module 1 includes a multiplicity of battery cells and powers, (e.g., drives), the electric propulsion 7.

Figure 3:
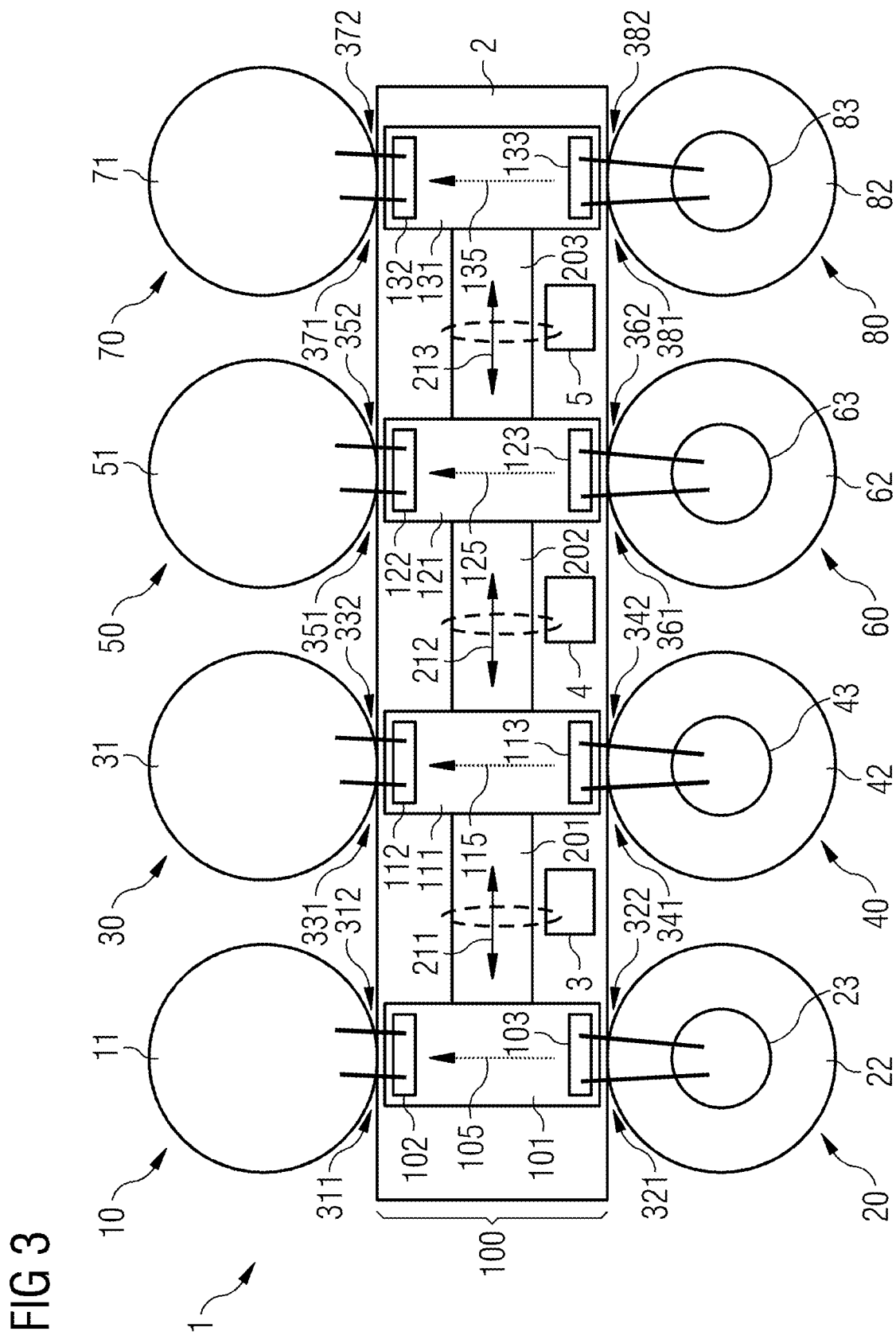
FIG. 3 a top view of an embodiment of a battery module.

FIG. 3 and FIG. 4 depict an embodiment of the battery module 1.

The battery module 1 includes a multiplicity of battery cells 10, 20, 30, 40, 50, 60, 70, 80, wherein each cell has a first contact electrode 11, 31, 51, 71 and a second contact electrode 13, 23, 43, 63, 83, similar to the negative electrode 11 and positive electrode 13 in FIG. 1.

The battery module 1 further includes a printed circuit board 2.

The printed circuit board 2 includes a first series-connector 101 with a first pad area 102 and a second pad area 103.

The printed circuit board 2 includes three second series-connectors 111, 121, 131 with a respective third pad area 112, 122, 132 and a respective fourth pad area 113, 123, 133.

The printed circuit board 2 includes further three cross-connectors 201-203, which connect the first series-connector 101 with each of the second series-connectors 111, 121, 131.

The first series-connector 101 is connected with the respective cross-connectors 201-203 between the first pad area 102 and the second pad area 103.

The respective second series-connectors 111, 121, 131 are connected with the respective cross-connectors 201-203 between the third pad area 112, 122, 132 and the fourth pad area 113, 123, 133.

The first contact electrode 11 of a first battery cell 10 of the multiplicity of battery cells 10, 20, 30, 40, 50, 60, 70, 80 is connected with the first pad area 102 by a first wiring component 311, 312.

The second contact electrode 23 of a second battery cell 20 of the multiplicity of battery cells 10, 20, 30, 40, 50, 60, 70, 80 is connected with the second pad area 103 by a second wiring component 321, 322.

The first contact electrode 31, 51, 71 of a third battery cell 30, 50, 70 of the multiplicity of battery cells 10, 20, 30, 40, 50, 60, 70, 80 is connected with the respective third pad area 112, 122, 132 of the at least one second series-connector 111, 121, 131 by a respective third wiring component 331, 332, 351, 352, 371, 372.

The second contact electrode 43, 63, 83 of a fourth battery cell 40, 60, 80 of the multiplicity of battery cells 10, 20, 30, 40, 50, 60, 70, 80 is connected with the respective fourth pad area 113, 123, 133 of the at least one second series-connector 111, 121, 131 by a respective fourth wiring component 341, 342, 361, 362, 381, 382.

The wiring component 311, 312, 321, 322, 331, 332, 341, 342, 351, 352, 361, 362, 371, 372, 381, 382 may be one or more bond wires, which are soldered, welded, or glued to the pad areas 102, 103, 112, 113, 122, 123, 132, 133 and the battery electrodes 11, 31, 51, 71, 23, 43, 63, 83, respectively.

The one or more bond wires, (e.g., two bond wires), may have a circular or a rectangular cross section and may be made of copper, aluminum, or gold.

The battery module 1 further includes sensors 3-5 configured to detect cross-currents 211-213, 221-223 at the cross-connectors 201-203.

FIG. 3 differs from FIG. 4 by the missing bonding wire 341 in FIG. 4.

The missing bonding wire 341 may have several reasons, for instance, a broken wire or a lost connection at the welding point of the wire at the battery cell 40. A damaged conductor at the printed circuit board 2 may also be a reason for the malfunction of the battery module 1.

In FIG. 3, a battery module 1 in regular operation is shown, where each interconnection between the printed circuit board 2 and the respective battery cell includes two wiring components 311, 312, 321, 322, 331, 332, 341, 342, 351, 352, 361, 362, 371, 372, 381, 382 in form of bonding wires.

Series-currents 105, 115, 125, 135 at the series-connectors 101, 111, 121, 131 are symmetrically balanced at regular operation and thus, cross-currents 211-213 are minimal or zero.

In case of a fault of the battery module at one element of the battery module 1, as indicated in FIG. 4 by the missing bonding wire 341, cross-currents 221-223 may flow through the cross-connectors 201-203, which indicates an asymmetric balance of the series-currents 106, 116, 126, 136 flowing through the individual cells, e.g., the series-connectors 101, 111, 121, 131. In other words, cross-currents 221-223 are not zero.

The asymmetric balance of the series-currents 106, 116, 126, 136 may be detected by the bridge arrangement, which enables a combined implementation of such a bridge to monitor the cross-currents 211-213 and 221-223 together with a cell interconnection structure 100 of the battery module 1.

The missing bonding wire 341 in FIG. 4 leads to a higher connection resistance between bonding pad area 113 and the battery cell 40, because the overall cross section of the resulting bonding component includes only wire 342.

Each bonding component may have sufficient dimensions that it may support the respective cell current without further bonding components to the same cell.

The sensors 3-5 may include a hall sensor to detect a magnetic field caused by the cross-currents 211-213, 221-223.

The sensors 3-5 may alternatively or additionally include a temperature sensor to detect a temperature or a temperature gradient caused by the cross-currents 211-213, 221-223.

The sensors 3-5 may be embedded, e.g., in a multi-layer board, into the printed circuit board 2 to achieve a tough coupling between a sensor component, like a loop, and the respective cross-connector 201-203.

The cross-connectors 201-203 itself may be embedded, for instance, to allow to provide a surface mounted temperature sensor element, e.g., a PT100 resistor.

In certain examples, the battery module may include a high number of battery cells and a high number of the interconnection structures 100 as described before.

Moreover, further measurement components are necessary to perform the current measurement with the bridge configuration as described above.

Although the disclosure has been illustrated and described in greater detail by the exemplary embodiments, the disclosure is not restricted by these exemplary embodiments. Other variations may be derived herefrom by the person skilled in the art, without departing from the scope of protection of the disclosure. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

| List of reference numerals: | |
|---|---|
| 1 | battery module |
| 2 | printed circuit board |
| 3, 4, 5 | sensor, magnet sensor or temperature sensor |
| 6 | aircraft |
| 7 | propulsion of aircraft |
| 10, 20, 30, 40, 50, 60, 70, 80 | battery cell |
| 11, 31, 51, 71 | negative electrode of battery cell |
| 12, 22, 42, 62, 82 | cell body |
| 13, 23, 43, 63, 83 | positive electrode of battery cell |
| 100 | connector structure |
| 101, 111, 121, 131 | series-connector |
| 102, 103, 112, 113, 122, 123, 132, 133 | bonding pads |
| 105, 115, 125, 135, 106, 116, 126, 136 | series-current |
| 201, 202, 203 | cross-connector |
| 211, 212, 213, 221, 222, 223 | cross-current |
| 311, 312, 321, 322, 331, 332, 341, 342, 351, 352, 361, 362, 371, 372, 381, 382 | Wire connector, bond wire |

The invention claimed is:

1. A battery module comprising:
a multiplicity of battery cells, wherein each cell of the multiplicity of battery cells has a first contact electrode and a second contact electrode;
a printed circuit board having a first series-connector with a first pad area and a second pad area, and a second series-connector with a third pad area and a fourth pad area;
a cross-connector connecting the first series-connector between the first pad area and the second pad area with the second series-connector between the third pad area and the fourth pad area; and
a sensor configured to detect a cross-current at the cross-connector,
wherein the first contact electrode of a first battery cell of the multiplicity of battery cells is connected with the first pad area by first wiring components,
wherein the second contact electrode of a second battery cell of the multiplicity of battery cells is connected with the second pad area by second wiring components,
wherein the first contact electrode of a third battery cell of the multiplicity of battery cells is connected with the third pad area of the second series-connector by third wiring components,
wherein the second contact electrode of a fourth battery cell of the multiplicity of battery cells is connected with the fourth pad area of the second series-connector by fourth wiring components,
wherein the first wiring components, the second wiring components, the third wiring components, and the fourth wiring components each comprise two bond wires configured to provide redundant bonding between a respective electrode and a respective pad area of a series-connector,
wherein the cross-current is configured to flow through the cross-connector in case of a fault of the battery module due to a connection failure of a bond wire of the two bond wires of a wiring component, and
wherein the sensor is configured to detect the connection failure of the bond wire of the two bond wires of the wiring component due to the detection of the cross-current.

2. The battery module of claim 1, wherein the sensor comprises a hall sensor.

3. The battery module of claim 2, wherein the sensor is embedded into the printed circuit board.

4. The battery module of claim 1, wherein the sensor comprises a temperature sensor.

5. The battery module of claim 4, wherein the sensor is embedded into the printed circuit board.

6. The battery module of claim 1, wherein the sensor is embedded into the printed circuit board.

7. The battery module of claim 1, wherein the battery module is located within an aircraft.

8. The battery module of claim 1, wherein the battery module is configured to power an electric propulsion system of an aircraft.

9. An aircraft comprising:
a battery module having:
a multiplicity of battery cells, wherein each cell of the multiplicity of battery cells has a first contact electrode and a second contact electrode;
a printed circuit board having a first series-connector with a first pad area and a second pad area, and a second series-connector with a third pad area and a fourth pad area;
a cross-connector connecting the first series-connector between the first pad area and the second pad area with the second series-connector between the third pad area and the fourth pad area; and
a sensor configured to detect a cross-current at the cross-connector,
wherein the first contact electrode of a first battery cell of the multiplicity of battery cells is connected with the first pad area by first wiring components,
wherein the second contact electrode of a second battery cell of the multiplicity of battery cells is connected with the second pad area by second wiring components,
wherein the first contact electrode of a third battery cell of the multiplicity of battery cells is connected with the third pad area of the second series-connector by third wiring components,
wherein the second contact electrode of a fourth battery cell of the multiplicity of battery cells is connected with the fourth pad area of the second series-connector by fourth wiring components,
wherein the first wiring components, the second wiring components, the third wiring components, and the fourth wiring components each comprise two bond wires configured to provide redundant bonding between a respective electrode and a respective pad area of a series-connector,
wherein the cross-current is configured to flow through the cross-connector in case of a fault of the battery module due to a connection failure of a bond wire of the two bond wires of a wiring component, and wherein the sensor is configured to detect the connection failure of the bond wire of the two bond wires of the wiring component due to the detection of the cross-current.

10. The aircraft of claim 9, further comprising:
an electric propulsion system,
wherein the battery module is configured to power the electric propulsion system.

11. The aircraft of claim 9, wherein the sensor comprises a hall sensor or a temperature sensor.

12. The aircraft of claim 11, wherein the sensor is embedded into the printed circuit board.

13. The aircraft of claim 9, wherein the sensor is embedded into the printed circuit board.

* * * * *